United States Patent [19]

Bulst et al.

[11] Patent Number: 4,682,130
[45] Date of Patent: Jul. 21, 1987

[54] FILTER FUNCTIONING WITH ACOUSTIC WAVES

[75] Inventors: Wolf-Eckhart Bulst, Vaterstetten; Gertrud Lindemann; Peter Zibis, both of Munich, all of Fed. Rep. of Germany

[73] Assignee: Siemens Aktiengesellschaft, Berlin and Munich, Fed. Rep. of Germany

[21] Appl. No.: 813,827

[22] Filed: Dec. 27, 1985

[30] Foreign Application Priority Data

Jan. 18, 1985 [DE] Fed. Rep. of Germany ....... 3501567

[51] Int. Cl.⁴ ...................... H03H 9/145; H03H 9/64; H01L 41/04
[52] U.S. Cl. .................................. 333/195; 29/25.35; 310/313 D; 427/100
[58] Field of Search ................... 333/150–155, 333/193–196; 310/313 R, 313 A, 313 B, 313 C, 313 D; 29/25.35, 594; 427/96, 100, 145, 160

[56] References Cited

U.S. PATENT DOCUMENTS 4,130,813 12/1978 Sandy et al. .................. 29/25.35 X
4,325,037 4/1982 Bulst et al. .......................... 333/194

FOREIGN PATENT DOCUMENTS 3314725 10/1984 Fed. Rep. of Germany .

Primary Examiner—Marvin L. Nussbaum
Attorney, Agent, or Firm—Hill, Van Santen, Steadman & Simpson

[57] ABSTRACT

Digital structures of a surface wave filter are manufactured in a photolithographic method with a lift-off or with an etching technique. The surface wave filter comprises at least one resonator structure, this resonator structure having auxiliary coatings of the substrate surface allocated to it. These auxiliary coatings are continuations of existing, neighboring pads which compensate during an exposure step associated with manufacture of the digital structures.

7 Claims, 2 Drawing Figures

FILTER FUNCTIONING WITH ACOUSTIC WAVES

RELATED APPLICATION

This application is related to a co-pending application of Bulst, Erthel, and Zibis entitled "FILTER FUNCTIONING WITH ACOUSTIC WAVES", Ser. No. 819,304, filed Jan. 16, 1986.

BACKGROUND OF THE INVENTION

The present invention relates to an improvement in the structure of a filter which functions with acoustic waves running close to the surface in a substrate and wherein the filter is formed of digital structures with overlapping fingers, with at least one of the structures comprising a transducer wherein respective fingers are connected to bus bars and associated large area pads.

A filter corresponding to the invention can be operated not only with acoustic surface waves (Rayleigh and Bleustein waves) in the narrowest sense, but also with Lamb waves, Love waves, surface-skimming bulk waves, and the like which proceed in a substrate at least close to the surface. The type of wave generated in the individual case depends on techniques in dimensioning the transducers which are known to a person skilled in the art, and may also depend on anisotropy properties of the substrate.

Surface wave resonator filters in the sense of the invention comprise digital structures situated on a piezo electric substrate, these digital structures including interdigital structures to be employed as transducers and reflector structures. Interdigital structures are composed of strip electrodes adjacent to one another and alternately electrically connected, or are connected to one another. The digital structure of a reflector is formed of strip-like fingers, finger pieces, dots or the like which are preferably metallization strips applied to the substrate surface.

An arrangement and dimensioning of the fingers, strips, and the like of structures are based on the rules for the respective filter. The fundamentals for dimensioning and measurement of the digital structures are known. Let German OS No. 29 09 705, U.S. Pat. No. 4,325,037, and German OS No. 3 314 725 be referenced in this regard, all of which are incorporated herein by reference.

Bus bars are provided for interdigital structures, the fingers of the respective one finger structure being connected to one another with these bus bars. The fingers of the one finger structure engage in comb-like fashion into a corresponding, second finger structure and form the interdigital structure therewith. A terminal pad, which is usually relatively large in area, connects to these bus bars situated to the side of the interdigital structure. The leads required for the interdigital structure employed as a transducer are connected to these pads connected to the respective bus bar, or form a part thereof.

The quality and performance of such a surface wave filter depend, among other things, on the exact fashioning, positioning, and precise, sharp-edged limitation of the strip-shaped fingers of the respective digital structure, whether this is a matter of an interdigital structure or of a reflector structure.

SUMMARY OF THE INVENTION

An object of the present invention is to specify such a structure or such structures for a surface wave filter which optimally meet these requirements.

This object is achieved with a surface wave filter structure wherein the respective structure of one or more existing reflector structures has auxiliary coatings of the substrate surface laterally allocated to it. These auxiliary coatings are extensions of large-area paths formed as part of the transducer structure. These auxiliary coatings as extensions run in a direction of the wave pattern along the substrate surface.

The present invention is based on the perception that the afore-mentioned deficiencies of a structure or of the structures of a surface wave filter are based on causes deriving in conjunction with the photolithographic manufacture and, in particular, in conjunction with the projection exposure of the photo-sensitive layer situated on the substrate surface. The tolerance available for the intensity of illumination of the photo-sensitive layer material available for sufficiently sharp contours of the strip-shaped fingers or coatings of the substrate surface to be manufactured is relatively narrowly dimensioned in the photolithographic process. As has been discovered, it is not sufficient to match the illumination intensity and illumination duration to one another in order to satisfactorily expose all parts of the structures to be manufactured at the same time. It must be considered that overshootings which emanate from large-area exposure points (in comparison to the fine structures of the strip-shaped finger elements) still enter to a considerable degree into the exposure of a surface element of the layer. Such large-area exposure points are the pads required for the application of the electric terminals of a transducer which are usually situated at both sides of an interdigital structure serving as the transducer. In accordance with the overshooting emanating from the areas of the pad, the exposure of the finger strips belonging to this interdigital structure is dimensioned in reduced fashion such that the necessary area-associated overall intensity (direct irradiation and overshooting component) is achieved in the final analysis for the exposure radiation for the respective strip-shaped finger element or for the respective strip-shaped coating of the structure. It is provided in the invention that such an overshooting—which is desirable per se for the reason cited above—also occurs for digital structures or arrangements of strip-shaped coatings for which no pad is to be provided per se. A terminal pad is not required in a reflector structure composed of strip-shaped coatings of the substrate surface which are not electrically connected.

As shall proceed in greater detail from the following specific description, it is then provided in the invention that auxiliary coatings be situated at both sides of a reflector structure, whereby such an auxiliary coating is to be viewed as a continuation of a pad of the neighboring transducer structure, this continuation extending in a longitudinal direction of the filter and laterally accompanying the reflector structure. For the sake of simplicity, such auxiliary coatings will be dimensioned such that they extend over the entire reflector structure. The same overshooting as in the case of a transducer structure provided with pads is thus achieved in the region of the strip-shaped coatings to be exposed. This is achieved for the entire corresponding reflector structure from its beginning up to its end by the areas of the accompanying auxiliary coatings. It can be seen that the width (b) of such an auxiliary coating should be dimensioned of the same size as the width of the corresponding, neighboring pad insofar as possible. In case of a separating gap between such an auxiliary coating and a bus bar of the reflector structure the width (b') of this separate auxiliary coating and the width of this bus bar together essentially may equal said width (b).

A lack of precision of a single strip-shaped coating has a disturbing effect in a reflector structure which differs in scale, depending on whether such a strip-shaped coating in the reflector structure is situated in such a region thereof where intensity of the wave is reflected to a high degree. An imprecise execution of a strip-shaped coating of a reflector structure is far less disturbing in strip-shaped coatings of the "distal end" of a reflector structure, namely in a region where the wave running in the reflector structure only has a considerably reduced intensity. Accordingly, it is not necessary in the invention to have these auxiliary coatings provided in accordance with the invention extend up to the outermost end E of an end position reflector structure. It is generally sufficient for such an auxiliary coating to extend at least over half the effective length of the corresponding reflector structure, namely proceeding from the beginning of the reflector structure into which the wave to be reflected is incident.

BRIEF DESCRITPION OF THE DRAWING

FIG. 1 shows the structure of a surface wave filter in plan view employing auxiliary coatings in accordance with the invention; and FIG. 2 shows in plan view an alternate embodiment of the invention wherein the auxiliary coatings are electrically separated from busbars of finger-like portions of a resonator structure.

DESCRIPTION OF THE PREFERRED EMBODIMENTS

Figure 1:
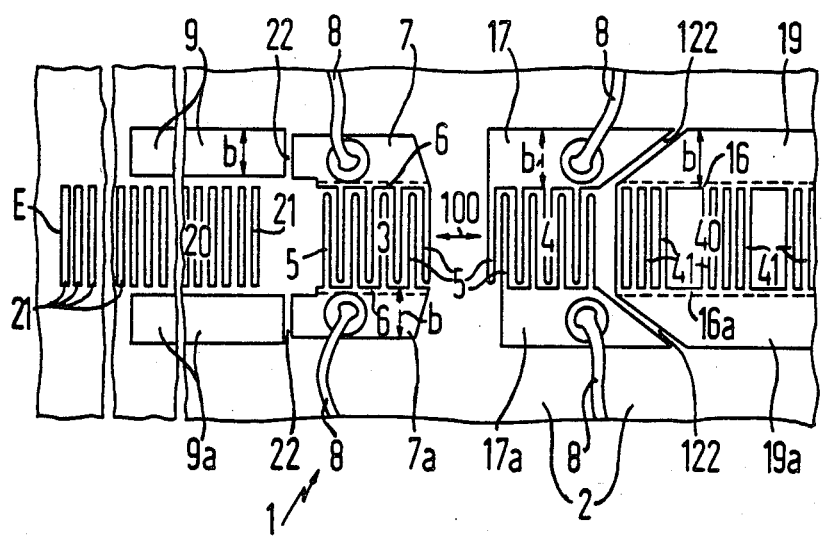

A surface wave filter corresponding to the invention is referenced 1, and wherein the structure thereof—shown only in part—is situated on the surface of a substrate 2 (only shown in part). Respective transducers, namely interdigital structures, are referenced 3 and 4, the one transducer thereof serving, for example, as an input transducer and the other as an output transducer. Reference numeral 5 indicates the strip-shaped coatings which are also referred to as fingers, digit strips, and the like. As is usual for an interdigital structure, these strip-shaped coatings 5 are alternately electrically connected to the respective bus bar 6. In the digital structure 3, these bus bars 6 are parts of the pads 7, 7a. Leads of the corresponding transducer connected to the pads 7, 7a are referenced 8. The surface-wise continuations of the pads 7, 7a provided in accordance with the invention are referenced 9, 9a. The surface referenced 9 is the continuation of the pad 7 and the surface referenced 9a is the continuation of the pad 7a. It can already be seen from this illustration in the drawing figure that overshooting occurring in the lithographic manufacture of the digital structure 3 for the strip-shaped coatings 5 of this digital structure 3 also occurs practically the same in a corresponding fashion for the strip-shaped coatings 21 of the illustrated reflector structure 20 as well. For the strip-shaped coatings 21, however, this overshooting emanates from the surfaces of the continuations 9 and 9a. Accordingly, the specific surface parts of these continuations 9 and 9a are dimensioned at least approximately of the same size as the specific surface parts of the pads 7 and 7a. The term "specific" therefore refers to the longitudinal direction or running direction of the filter 1 referenced with the arrow 100.

The strip-shaped coatings 21 of the digital structure 20 acting as a resonator do not comprise any bus bars, this not being necessary for a reflector structure.

It is preferable for electrical reasons to electrically separate the surface-wise continuations 9 or 9a from the neighboring pad 7 or 7a. This can be achieved in a simple fashion with the assistance of the illustrated interruptions 22 which are narrow strips without metal coating situated between the pad 7 and the continuation 9, or between the pad 7a and the continuation 9a. In the lithographic manufacturing process, these strips 22 correspond to locations which do not experience any exposure. The elimination of overshooting otherwise emanating from these strips 22 (given omission of such strips 22) is not a disadvantage in the framework of the invention, particularly when these strips 22 are placed in a region of the filter 1 (as shown at the left in the figure) in whose immediate proximity no strip-shaped coating is to be generated or provided.

As may further be seen from the drawing FIG. 1, the surface-wise continuations 9 and 9a of the invention do not extend up to the outermost edge of the illustrated reflector structure 20. As was already indicated above, the strip-shaped coatings present at that end of the reflector structure 20 opposite the point of incidence of the wave only have a comparatively far less significant influence on the overall reflection of the structure 20. Deviations from the attainable precision which occur in the positioning and edge sharpness of such strip-shaped coatings 21 present at the end of the reflector structure 20 are therefore already of a negligible influence. Particularly for the sake of simplicity, however, these continuations 9, 9a will be allowed to extend to the outermost end of the respective reflector structure in practice, namely the reflector structure accompanied by these continuations 9, 9a.

As also proceeds from FIG. 1, the digital structures of a resonator filter of the type shown are generally arranged at least essentially symmetrical. In the case of the present FIG. 1, the right half (in FIG. 1), of the filter 1 can be designed identical to the left half already described. The following description, however, relates to a modification lying within the framework of the invention, whereby this modification of the right half can in turn identically fill out the left half of the filter as well. Let it be expressly pointed out, however, that symmetry is not a necessity for a filter of the invention.

The pads of the interdigital structure 4 are referenced 17 and 17a. Moreover, that stated above regarding FIG. 3 also applies to this structure, at least by analogy.

Reference numeral 40 references a resonator structure having the strip-shaped coatings 41. Reference numerals 19 and 19a illustrate inventively provided, surface-wise continuations of the pads 17 or 17a. These continuations 19, 19a differ from the continuations 9 and 9a since they extend up to the strip-shaped coatings (fingers, digit strips) 41 of the reflector structure 40, and can even be in electrical contact with them. The continuations 19 and 19a provided in accordance with the invention differ from the bus bars 16, 16a of a reflector structure which are already employed in individual cases, as is known, particularly on the basis of their significantly greater width b. Their width b is essentially the same size as that of the pads 17, 17a. Given this illustrated embodiment of the invention, moreover, the electrical interruption 122 is required so that a short between the transducer 4 and the reflector structure 40 is suppressed.

The interruptions 122 which correspond per se to the interruptions 22 are situated at an angle as shown. This oblique arrangement is an advantage within the scope of the invention particularly when there is no distance, or only a relatively small distance, present between the transducer structure 4 and the following reflector structure 40, or when this interruption (interruptions) 122 is (are) already laterally positioned next to the reflector structure. This oblique arrangement of the interruptions 122, as may be seen from the figure, does not have a noticeably disturbing influence due to this oblique arrangement on the uniformity of the overshooting, both for the strip-shaped coatings 5 of the digital structure 4 as well as the strip-shaped coatings 41 of the reflector structure 40.

Dimensions which are typical for a filter of the invention shall be set forth below.

A transducer structure 3, 4 has, for example, 10 to 400, and preferably 50 to 150, strip-shaped coatings in an interdigital arrangement.

The respective number of strip-shaped coatings of a transducer or reflector structure is based on the respectively prescribed bandwidth.

Width and center-to-center spacing of the strip-shaped coatings from one another are established by the prescribed frequency or wavelength of the acoustic wave, and by the wave propagation speed in the substrate body. Standard values are 0.5 to 5 $\mu$m for the strip width and 1 to 10 $\mu$m for the center-to-center spacing.

The length of the individual strip-shaped coatings is usually dimensioned between 20 and 200 wavelengths.

The width b of a pad 7, 7a; 17, 17a, and thus of the continuations 9, 9a; 19, 19a provided in accordance with the invention lies between 10 and 300 $\mu$m. As a comparison thereto, the standard width of a bus bar 6 is specified, this usually lying between 1 and 10 $\mu$m, i.e. a bus bar is extremely narrow in comparison to the width dimension b of a pad, so that it can be seen what is a pad and what is only a bus bar.

The above description of the invention takes manufacture of the digital structures based on the principle of the lift-off technique into consideration. A positive photo-sensitive resist is employed in this technology. A surface-wide coating with such a photoresist is first undertaken on the substrate surface. An exposure corresponding to the desired structures then follows, namely those surface portions of the layer situated on the substrate surface which are subsequently the strip-shaped coatings 5, 21, 41; pads 7, 7a, 17, 17a; bus bars; and the inventively provided auxiliary coatings 9, 91, 19, 19a are exposed. After developing, the exposed part of the photoresist is dissolved and the entire surface (exposed surface portions of the substrate surface and photoresist which still remains) is coated with a metal layer (vapor-deposited). Finally, the surface portions of the photoresist which still remain are stripped, those portions of a metal layer which are situated on the photoresist are lifted off, and the desired structures remain on the substrate surface as metallic coatings.

A manufacture of the structures based on a principle of etching technology is, so to speak, the opposite process (ensuing with the same final result). The substrate surface is thus first coated with a metal layer. This metal layer is covered with the photoresist layer and the exposure now occurs, this exposure however, affecting those surface portions which are free of metallizations of the substrate surface in the finished filter. Stripping is carried out after developing the exposed photoresist, whereby the metallization layer present on the substrate surface is exposed in those surface portions which must be free of metallization of the substrate surface in the finished filter. These exposed portions of the metallization layer are removed from the substrate surface by subsequent etching, and those portions of the original metallization of the substrate surface protected during the etching by the remaining surface portions of the photoresist layer remain as desired structures of the filter.

The lift-off technique and the etching technique differ from one another since the respective complementary surface portions are to be exposed. In the lift-off technique, the overshooting emanates from the pads and from the auxiliary coatings provided in accordance with the invention. Given the etching technique, overshooting occurs in the region of the reflector structure which does not comprise any pads, namely when the inventive technique of the auxiliary coatings has not been carried out. If the exposure (including the overshooting) in the method of etching technique were to be adapted to the degree suitable for the reflector structure 20, 40, namely without auxiliary coatings 9, 9a; 19, 19a having been provided, underexposure would exist in the region of the interdigital structures 3, 4 because, due to the existing pads, no overshooting appears there in the exposure pattern corresponding to the etching technique. If, by contrast, this exposure were matched to the degree necessary for the interdigital structures, then overexposure would exist for the respective resonator structure, namely as a consequence of the over-shooting. When auxiliary coatings 9, 9a; 19, 19a in accordance with the invention are provided along the sides of the respective resonator structure 20, 40 using the principle of etching as well, then the same, stated goal of levelled exposures is also achieved given the etching technique, namely just as in the application of the invention given the lift-off technique in the application described in general and specifically above.

Figure 2:
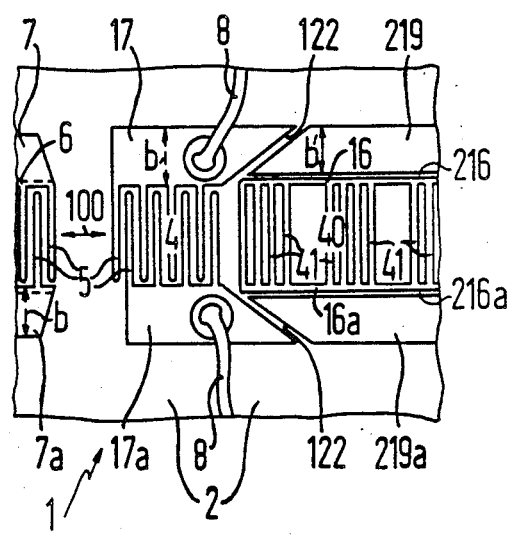

All features and minutes of FIG. 2 are preferably identical to that of FIG. 1, except there is a respective gap 216, 216a between the respective auxiliary coating 219, 219a and a neighbouring bus bar 16, 16a of the reflector structure 40. The width b' of the auxiliary coating 219, 219a plus the width of the bus bar 16, 16a may in the sense of the invention be equal to the width b of the auxiliary coating 19, 19a of FIG. 1 as the gap 216, 216a between may be relatively small.

Although various minor changes and modifications might be proposed by those skilled in the art, it will be understood that we wish to include within the claims of the patent warranted hereon all such changes and modifications as reasonably come within our contribution to the art.

We claim as our invention:

1. An electric acoustic wave filter, comprising:
a substrate having at least one electrically conductive transducer structure formed of finger-like portions and a large-area pad connecting to the finger-like portions on each side of the transducer structure, said large-area pads having leads connected thereto and having a substantially larger width in a direction perpendicular to wave propagation through the transducer structure as compared to a width of busbars which would connect the respective finger-like portions if a large-area pad was not required for connecting with a lead;

at least one reflector structure arranged directly next to the transducer structure, said reflector structure having a plurality of finger-like portions arranged for reflection of waves travelling along the wave propagation direction;

an auxiliary coating running along the wave propagation direction at both sides of the reflector structure and adjacent ends of the finger-like portions thereof, said auxiliary coatings having a width in said direction perpendicular to the wave propagation direction approximately the same as said width of the respective large-area pads, said auxiliary coatings extending along at least that portion of the reflector structure in the direction of wave propagation which is essential for functioning of reflection by said structure; and said auxiliary coatings being electrically separated from said respective large-area pads by a relatively small interruption compared to a length of said large-area pads in the wave propagation direction, whereby said auxiliary coatings provide exposure compensation during an exposure of the digital structures during manufacture of the finger-like portions since said widths of said auxiliary coatings correspond to the respective widths of the large-area pads so that a substantially same over-shooting occurs in regions of said reflector structure as occurs in regions of said transducer structure.

2. A wave filter according to claim 1 wherein said reflector structure and auxiliary coatings are electrically conductive.

3. A wave filter according to claim 2 wherein the reflector structure has a busbar connecting to the finger-like portions and the respective auxiliary coatings are electrically connected to the respective busbars of the reflector structure.

4. A wave filter according to claim 1 wherein said reflector structure has busbars connecting to the finger-like portions and wherein the respective auxiliary coatings are electrically separated with respect to the busbars of the reflector structure.

5. A wave filter according to claim 1 wherein said auxiliary coatings extend over a full length of the reflector structure in the wave propagation direction.

6. A wave filter according to claim 1 wherein said auxiliary coatings substantially represent an area-wise extension of the corresponding large-area pads of the transducer directly next to the reflector structure.

7. A method for the manufacture of an acoustic wave electric filter, comprising the steps of:

providing a substrate having at least one electrically conductive transducer structure formed of finger-like portions and a large-area pad connecting to the finger-like portions on each side of the transducer structure, said large-area pads having leads connected thereto and having a substantially large width in a direction perpendicular to wave propagation through the transducer structure as compared to a width of busbars which would connect the respective finger-like portions if a large-area pad was not required for connecting with a lead;

arranging at least one reflector structure directly next to the transducer structure, said reflector structure having a plurality of finger-like portions arranged for reflection of waves travelling along the wave propagation direction;

providing an auxiliary coating running along the wave propagation direction at both sides of the reflector structure and adjacent ends of the finger-like portions thereof, said auxiliary coating having a width in said direction perpendicular to the wave propagation direction approximately the same as said width of the respective large-area pads, said auxiliary coatings extending along at least that portion of the reflector structure in the direction of wave propagation which is essential for functioning of reflection by said structure; and electrically separating said auxiliary coatings from said respective large-area pads by a relatively small interruption compared to a length of said large-area pads in the wave propagation direction, whereby said auxiliary coatings provide exposure compensation during an exposure of the digital structures during manufacture of the finger-like portions since said widths of said auxiliary coatings correspond to the respective widths of the large-area pads so that a substantially same over-shooting occurs in regions of said reflector structure as occurs in regions of said transducer structure.

* * * * *